(12) United States Patent
Ball

(10) Patent No.: US 6,407,456 B1
(45) Date of Patent: Jun. 18, 2002

(54) MULTI-CHIP DEVICE UTILIZING A FLIP CHIP AND WIRE BOND ASSEMBLY

(75) Inventor: Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/510,817

(22) Filed: Feb. 23, 2000

Related U.S. Application Data

(63) Continuation of application No. 08/602,503, filed on Feb. 20, 1996.

(51) Int. Cl.[7] ............................................. H01L 23/48
(52) U.S. Cl. ..................... 257/777; 257/686; 257/738; 257/778; 257/780; 257/783; 257/784; 361/783
(58) Field of Search ................................ 257/685, 686, 257/723, 724, 777, 778, 782, 737, 738, 776, 780, 783, 784; 438/106, 108; 361/735, 783

(56) References Cited

U.S. PATENT DOCUMENTS

| | | | |
|---|---|---|---|
| 5,012,323 A | | 4/1991 | Farnworth .................. 257/723 |
| 5,128,831 A | | 7/1992 | Fox, III et al. ............. 361/396 |
| 5,291,061 A | | 3/1994 | Ball .......................... 257/686 |
| 5,322,207 A | | 6/1994 | Fogal et al. .............. 228/180.5 |
| 5,323,060 A | | 6/1994 | Fogal et al. ................ 257/777 |
| 5,387,815 A | * | 2/1995 | Nishiguchi .................. 257/704 |
| 5,399,898 A | | 3/1995 | Rostoker .................... 257/499 |
| 5,422,435 A | | 6/1995 | Takiar et al. ............... 174/52.4 |
| 5,426,566 A | | 6/1995 | Beilstein, Jr. et al. ...... 361/735 |
| 5,434,745 A | | 7/1995 | Shokrgozar et al. ........ 361/735 |
| 5,483,024 A | | 1/1996 | Russell et al. ............. 174/52.4 |
| 5,600,175 A | | 2/1997 | Orthmann ................... 257/532 |
| 5,721,452 A | * | 2/1998 | Fogal et al. ................ 257/685 |
| 5,874,781 A | * | 2/1999 | Fogal et al. ................ 257/777 |
| 5,886,412 A | * | 3/1999 | Fogal et al. ................ 257/777 |
| 5,963,794 A | * | 10/1999 | Fogal et al. ................ 438/108 |
| 6,051,886 A | * | 4/2000 | Fogal et al. ................ 257/777 |
| 6,215,193 B1 | * | 4/2001 | Tao et al. ................... 257/777 |

FOREIGN PATENT DOCUMENTS

| | | |
|---|---|---|
| JP | 62-8534 | 1/1987 |
| JP | 63-104343 | 5/1988 |
| JP | 63-179537 | 7/1988 |
| JP | 1-303730 | 12/1989 |
| JP | 5-13665 | 1/1993 |

OTHER PUBLICATIONS

IBM Technical Disclosure Bulletin, vol. 28, No. 2, Jul. 1995, p. 811.*

IBM Technical Disclosure Bulletin, vol. 12, No. 10, Mar. 1970, p. 1579.*

H.K. Charles, Jr., Electrical Interconnection, Electronic Materials Handbook™, vol. 1, Packaging, pp. 224–236 (Nov. 1989).

* cited by examiner

*Primary Examiner*—Olik Chaudhuri
*Assistant Examiner*—Alonzo Chambliss
(74) *Attorney, Agent, or Firm*—TraskBritt

(57) ABSTRACT

An apparatus and method for increasing integrated circuit density comprising an upper die and a lower die, the latter preferably a flip-chip, which are connected to a conductor-carrying substrate or a leadframe. The upper die is attached back-to-back to the lower die with a layer of adhesive applied over the back side of the lower die. Bond wires or TAB leads are attached between bond pads on the upper die and corresponding conductive trace or lead ends on the substrate. The upper die may be smaller than the lower die such that a small discrete component such as a resistor, capacitor, or the like can be attached to the adhesive not covered by the upper die. Bond wires can be attached between the upper die and the component, as well as between the component and the substrate. One or more additional die may be stacked on the upper die and electrically connected to the substrate. Furthermore, multiple lower dice can be arranged on the substrate to support upper dice bridged between the lower dice.

15 Claims, 4 Drawing Sheets

MULTI-CHIP DEVICE UTILIZING A FLIP CHIP AND WIRE BOND ASSEMBLY

CROSS REFERENCE TO RELATED APPLICATION

This application is a continuation of application Ser. No. 08/602,503, filed Feb. 20, 1996, pending.

BACKGROUND OF THE INVENTION

1. Field of the Invention

The present invention relates to an apparatus and a method for increasing semiconductor device density. In particular, the present invention relates to a vertical multi-chip device using combined flip chip and wire bond assembly techniques to achieve densely packaged semiconductor devices, and a method for producing such devices.

2. State of the Art

Definitions: The following terms and acronyms will be used throughout the application and are defined as follows:

BGA—Ball Grid Array: An array of minute solder balls disposed on an attachment surface of a semiconductor die wherein the solder balls are refluxed for simultaneous attachment and electrical communication of the semiconductor die to a printed circuit board.

COB—Chip On Board: The techniques used to attach semiconductor dice to a printed circuit board, including flip chip attachment, wirebonding, and tape automated bonding ("TAB").

Flip Chip: A chip or die that has a pattern or array of terminations spaced around the active surface of the die for face down mounting of the die to a substrate.

Flip Chip Attachment: A method of attaching a semiconductor die to a substrate in which the die is inverted so that the connecting conductor pads on the face of the device are set on mirror-image pads on the substrate (such as a printed circuit board), and bonded by solder reflux or a conductive polymer curing.

Glob Top: A glob of encapsulant material (usually epoxy or silicone or a combination thereof) surrounding a semiconductor die in a COB assembly.

PGA—Pin Grid Array: An array of small pins extending substantially perpendicularly from the major plane of a semiconductor die, wherein the pins conform to a specific arrangement on a printed circuit board or other substrate for attachment thereto.

SLICC—Slightly Larger than Integrated Circuit Carrier: An array of minute solder balls disposed on an attachment surface of a semiconductor die similar to a BGA, but having a smaller solder ball pitch and diameter than a BGA.

State-of-the-art COB technology generally consists of three semiconductor die to printed circuit board conductive attachment techniques: flip chip attachment, wirebonding, and TAB.

Flip chip attachment consists of attaching a semiconductor die, generally having a BGA, an SLICC or a PGA, to a printed circuit board. With the BGA or SLICC, the solder or other conductive ball arrangement on the semiconductor die must be a mirrorimage of the connecting bond pads on the printed circuit board such that precise connection is made. The semiconductor die is bonded to the printed circuit board by refluxing the solder balls. With the PGA, the pin arrangement of the semiconductor die must be a mirror-image of the pin recesses on the printed circuit board. After insertion, the semiconductor die is generally bonded by soldering the pins into place. An under-fill encapsulant is generally disposed between the semiconductor die and the printed circuit board for environmental protection and to enhance the attachment of the die to the board. A variation of the pin-in-recess PGA is a J-lead PGA, wherein the loops of the J's are soldered to pads on the surface of the circuit board. Nonetheless, the lead and pad locations must coincide, as with the other referenced flip-chip techniques.

Wirebonding and TAB attachment generally begins with attaching a semiconductor die to the surface of a printed circuit board with an appropriate adhesive, such as an epoxy. In wirebonding, a plurality of bond wires are attached, one at a time, to each bond pad on the semiconductor die and extend to a corresponding lead or trace end on the printed circuit board. The bond wires are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. The die may be oriented either face up or face down (with its active surface and bond pads either up or down with respect to the circuit board) for wire bonding, although face up orientation is more common. With TAB, ends of metal leads carried on an insulating tape such as a polyimide are respectively attached to the bond pads on the semiconductor die and to the lead or trace ends on the printed circuit board. An encapsulant is generally used to cover the bond wires and metal tape leads to prevent contamination.

Higher performance, lower cost, increased miniaturization of components, and greater packaging density of integrated circuits are ongoing goals of the computer industry. Greater integrated circuit density is primarily limited by the space or "real estate" available for mounting die on a substrate such as a printed circuit board. Conventional lead frame design inherently limits package density for a given die size because the die-attach paddle of the lead frame must be larger than the die to which it is bonded. The larger the die, the less space that remains around the periphery of the diebonding pad for wire bonding. Furthermore, the wire bonding pads on the standard lead frame provide anchorage for the leads when the leads and the die are encapsulated in plastic. Therefore, as the die size is increased in relation to a given package size, there is a corresponding reduction in the space along the sides of the package for the encapsulating plastic which joins the top and bottom of the plastic body at the mold part line and anchors the leads. Thus, as the leads and encapsulant are subjected to the normal stresses of subsequent forming and assembly operations, the encapsulating plastic may crack, compromising package integrity and substantially increasing the probability of premature device failure.

A so-called "leads over chip" (LOC) arrangement eliminates the die-attach paddle of the lead frame and supports the die by its active surface from the inner lead ends of the lead frame. This permits a wider variety of bond pad patterns on the die, extends the leads-to-encapsulant bond area and, with appropriate design parameters, can reduce the size of the packaged device for a given die size.

One method of increasing integrated circuit density is to stack die vertically. U.S. Pat. No. 5,012,323 ("the '323 patent") issued Apr. 30, 1991 to Farnworth teaches combining a pair of die mounted on opposing sides of a lead frame. An upper, smaller die is back-bonded to the upper surface of the leads of the lead frame via a first adhesively coated, insulated film layer. A lower, larger die is face-bonded to the lower lead frame die-bonding region via a second, adhesively coated, insulative film layer. The wire-bonding pads on both upper die and lower die are interconnected with the ends of their associated lead extensions with gold or aluminum bond wires. The lower die must be slightly larger than the upper die in order for the die pads are to be accessible from above through a bonding window in the lead frame such that gold wire connections can be made to the lead extensions. This arrangement has a major disadvantage from a production standpoint, since the different size dice require that different equipment produce the different die or that the same equipment be switched over in different production runs to produce the different die.

U.S. Pat. No. 5,291,061 issued Mar. 1, 1994 to Ball teaches a multiple stacked die device containing up to four stacked dice supported on a die-attach paddle of a lead frame, the assembly not exceeding the height of current single die packages, and wherein the bond pads of each die are wirebonded to lead fingers. The low profile of the device is achieved by close-tolerance stacking which is made possible by a low-loop-profile wirebonding operation and thin adhesive layers between the stacked dice.

U.S. Pat. No. 5,323,060 issued Jun. 21, 1994 to Fogal et al. teaches a multichip module that contains stacked die devices, the terminals or bond pads of which are wirebonded to a substrate or to adjacent die devices.

U.S. Pat. No. 5,422,435 to Takiar et al. teaches stacked dice having wire bonds extending to each other and to the leads of a carrier member such as a lead frame.

U.S. Pat. No. 5,399,898 issued May 21, 1995 to Rostoker ("Rostoker") teaches multichip, multitier semiconductor arrangements based on single and double-sided flip-chips. Rostoker discloses bridging a die over and between two adjacent dice. However, Rostoker intuitively requires the die and bond pad bump patterns be specifically designed to achieve proper electrical communication between the bridged die.

Therefore, it would be advantageous to develop a technique and assembly for increasing integrated circuit density using non-customized die configurations in combination with commercially-available, widely-practiced semiconductor device fabrication techniques.

SUMMARY OF THE INVENTION

The present invention relates to an apparatus and a method for increasing integrated circuit density. The apparatus comprises at least an upper die and an opposing lower die which is connected to a substrate (the term "substrate" will be used for purposes of this application to mean either substrate carrying traces or other conductors, or a leadframe). The lower die is preferably a flip chip having, for example, C4 solder bump connections, conductive polymer bumps, pin connections, or surface mount J-lead connections extending substantially perpendicularly from the face surface of the lower die. The substrate is configured with a specific lead end or trace end pattern compatible with the specific pin out or bump connections on the flip-chip.

A layer of adhesive, in some instances an electrically insulative adhesive as required or desired to electrically isolate adjacent dice, is applied over the back side of the lower die. The back side of the upper die is placed on the adhesive, thereby attaching the upper die to the lower die, and the adhesive is cured. Preferably, the face or active side of the upper die includes a plurality of bond pads. Bond wires of gold, aluminum or other suitable materials as known in the art are attached between the upper die bond pads and a corresponding trace end or lead end on the substrate.

It is, of course, understood that the electrical connection between the upper die and the substrate can be achieved with TAB technology, wherein metal tape leads are attached between the bond pads on the upper die and the leads on the substrate. However, such an approach obviously requires undesirable pre-planning of bond pad and trace end locations for fabrication of the TAB tape.

An encapsulant is generally used to cover the bond wires and metal tape leads to prevent contamination. Preferably, the exposed circuitry of the die stack is sealed from contamination by an underflow compound for the (lower) flip chip and a glob top over the entire assembly after wire bonding.

Such an arrangement increases semiconductor device density using noncustomized die and bond pad patterns, and commercially-practiced conductor attachment techniques.

If the upper die is smaller than the lower die, one or more small, additional, discrete components such as resistors, capacitors, or the like can be attached to the back side of the lower die via a portion of the adhesive not covered by the upper die. Bond wires can be attached between the upper die and the discrete component(s), if desired, as well as between the component(s) and the substrate. This arrangement frees up real estate on the substrate that would normally be taken up by the component, thereby further increasing potential integrated circuit density.

A multitude of die arrangements can be conceived using the technique of the present invention. For example, an additional (third) die can be added to the above arrangement. An adhesive is added to the active surface or face of the upper die (without covering the bond pads) and the back side of the additional die is applied to the adhesive, thereby attaching the additional die to the upper die. Preferably, the face side of the additional die has a plurality of bond pads. Bond wires are attached between the additional die bond pads and corresponding trace or lead ends on the substrate.

Of course, the bond wires can be attached from the additional (third) die to a component attached to the adhesive not covered by the upper die, and/or, if the additional die is smaller than the upper die, a component can be attached to the adhesive on the face of the upper die and bond wires attached thereto.

As another example, a pair of lower dice can be connected to the substrate with the upper die bridged between the lower die. The upper die is adhered to both lower dice with the layers of adhesive applied over both lower dice back sides. Bond wires are attached in the manner discussed above. Furthermore, still more additional dice can be stacked or discrete components attached to the assembly in the manner discussed above.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
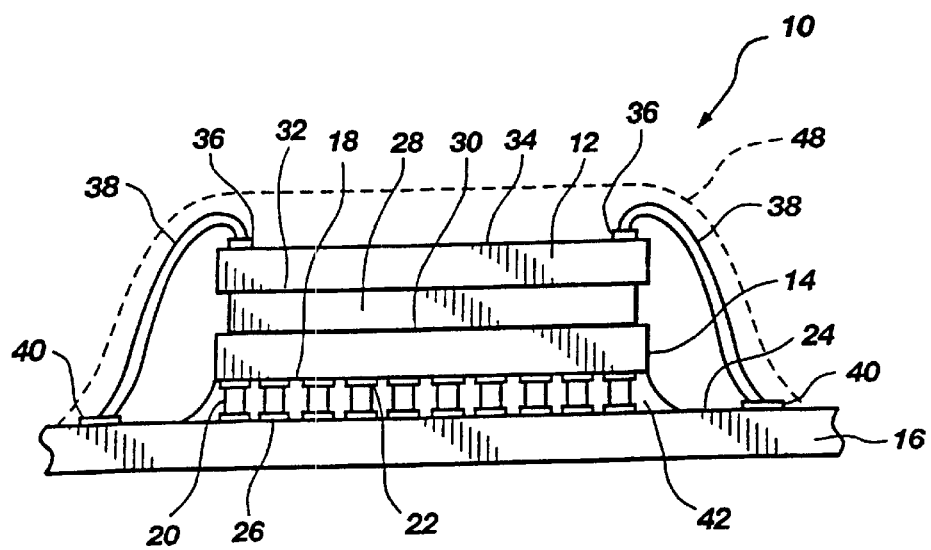
FIG. 1 is a side plan view of a preferred assembly of the present invention.

FIG. 1 illustrates a bare die assembly 10 of the present invention. The assembly 10 comprises an upper die 12 and an opposing lower die 14 which is connected to a leadframe or other substrate 16. Fabrication of the assembly 10 comprises providing the lower die 14 having a face surface 18 with at least one flip chip electric connection 20 (such as a C4 solder bump connection, conductive polymer bump or pin connection, these and other alternatives being known in the art, by way of example) extending from a bond pad or other terminal 22 on the lower die face surface 18. The flip chip electric connections 20 extend to a surface 24 of the substrate 16 in such a manner that the flip chip electric connections 20 physically (mechanically) attach to, and make electrical contact with, lead ends, trace ends, terminals or other electrical contact elements 26 in or on the surface 24 of the substrate 16. A back side 32 of the upper die 12 is adhered to the lower die 14 with a layer of adhesive 28 applied over a lower die back side 30. An adhesive requiring a curing step, such as an epoxy, is preferred, although many adhesives known in the art are suitable.

A face side 34 of the upper die 12 has a plurality of bond pads 36 disposed thereon. A plurality of bond wires 38 are attached between the upper die bond pads 36 and corresponding trace or lead ends or other terminals 40 on the upper surface 24 of the substrate 16.

Preferably, a sealing (underfill) compound 42 as known in the art is disposed between the lower die 14 and the substrate 16 to prevent contamination of the die-to-substrate board connections 20 and to more firmly secure the lower die 14 to the substrate 16. A glob top 48 may be applied over assembly 10 individually as shown in broken lines, or over the entire substrate 16, which may support a plurality of assemblies 10. The subsequently-described embodiments may similarly be glob-topped, as desired.

Substrate 16, if an insulative substrate, may itself be connected to a chassis or mother board by edge connections, bump connections, pin connections, or other conductive arrangements as known in the art. If substrate 16 is a lead frame, the outer lead ends may engage a higher-level package as known in the art.

Figure 2:
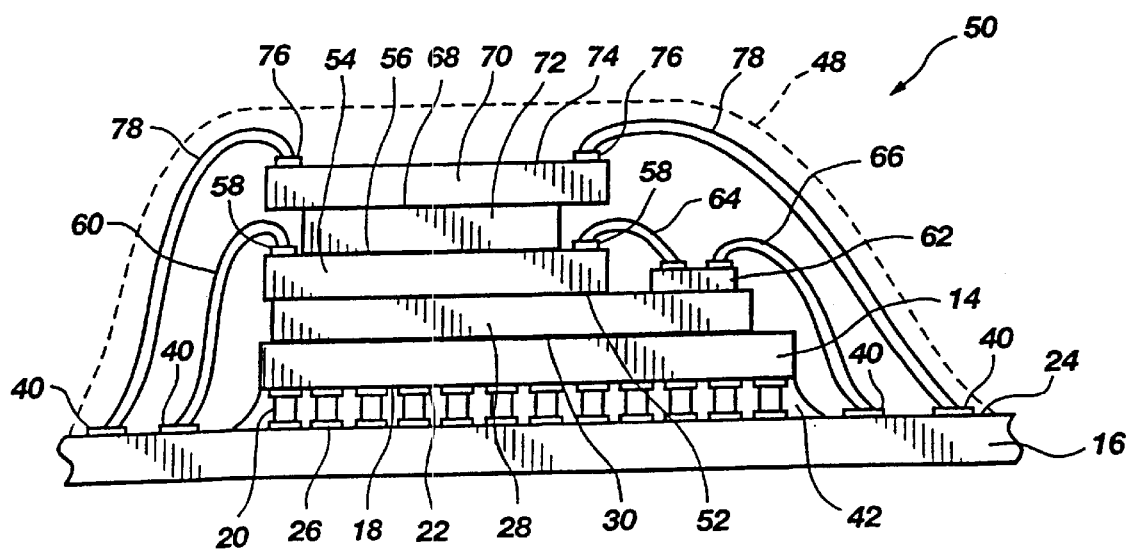
FIG. 2 is a side plan view of an alternate assembly of the present invention.

FIG. 2 illustrates an alternative bare die assembly 50 of the present invention. Components common to both FIG. 1 and FIG. 2 retain the same numeric designation. The assembly 50 comprises a first, lower die 14 connected to the supporting substrate or leadframe 16. The lower die 14 comprises a face or active surface 18 with at least one flip chip electric connection 20 extending from the bond pad 22 on the lower die face surface 18. The flip chip electric connections 20 are made with the upper surface 24 of the substrate 16 in such a manner that the flip chip electric connections 20 mechanically bond and electrically contact the electrical contact elements 26 in or on the surface 24 of the substrate 16.

A back side 52 of a second die 54 is adhered to the lower die 14 with the layer of adhesive 28 applied over the lower die back side 30. A face side 56 of the second die 54 has a plurality of bond pads 58 disposed thereon. A plurality of bond wires 60 is attached between the second die bond pads 58 and corresponding trace or lead ends 40 on the upper surface 24 of the substrate 16. Additionally, as shown in FIG. 2, if the second die 54 is slightly smaller than the lower die 14, an additional component 62, such as a resistor, capacitor, or the like, may be adhered to the layer of adhesive 28 on the lower die back side 30. This arrangement frees up space on the substrate 16 that would normally be taken up by the component 62. A second die-to-component bond wire 64 is attached between a respective second die bond pad 58 and the component 62. A component-to-substrate bond wire 66 is attached between the component 62 and trace or lead end 40 on the upper surface 24 of the substrate 16.

A back side 68 of a third die 70 is adhered to the second die 54 with a second layer of adhesive 72 applied on the second die face side 56. A face side 74 of the third die 70 has a plurality of bond pads 76 disposed thereon. A plurality of bond wires 78 is attached between the third die bond pads 76 and corresponding trace lead ends 40 on the upper surface 24 of the substrate 16. Wire bonds could also be made from third die 70 to component 62, or to yet another discrete component stacked on and adhered to third die 70.

Figure 3:
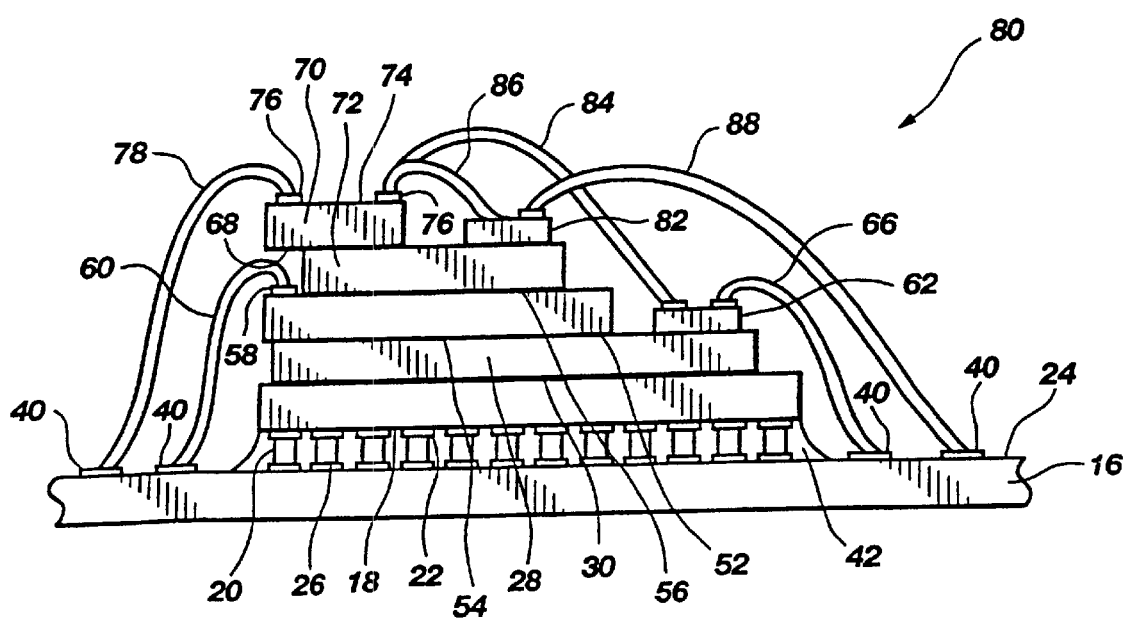
FIG. 3 is a side plan view of another alternate assembly of the present invention.

FIG. 3 illustrates another alternative bare die assembly 80, comprising a second discrete component 82 adhered to the second layer of adhesive 72. A third die-to-component bond wire 84 is attached between a respective third die bond pad 76 and the component 62. A first component-to-substrate bond wire 66 is attached between the component 62 and the upper surface 24 of the substrate 16. A third die-to-second component bond wire 86 is attached between a respective second die bond pad 76 and the second component 82. A second component-to-substrate bond wire 88 is attached between the component 82 and the upper surface 24 of the substrate 16.

It is, of course, understood that a number of configurations of this embodiment could be constructed, including stacks of more than three dice.

Figure 4:
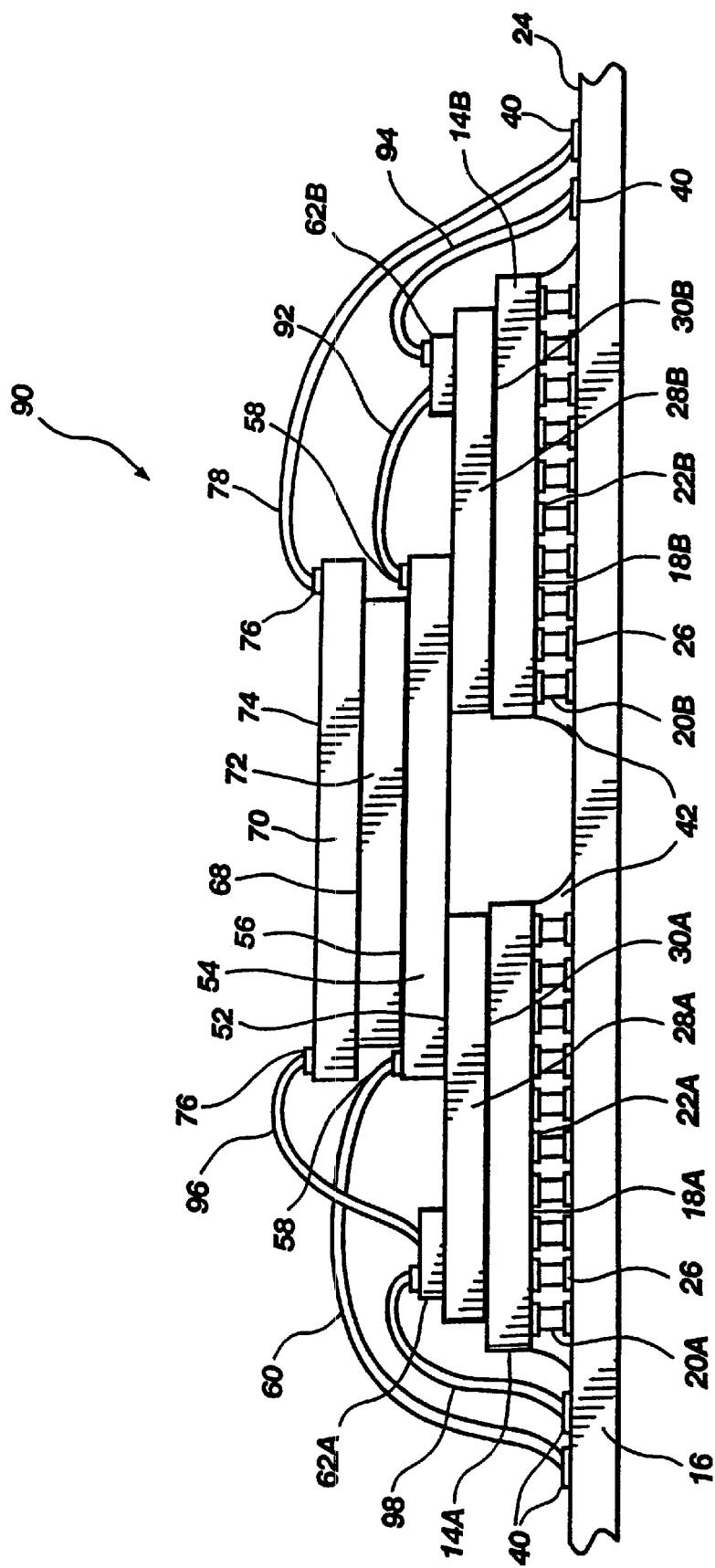
FIG. 4 is a side plan view of yet another alternative assembly of the present invention.

FIG. 4 illustrates a multiple base bare die assembly 90 of the present invention. Components common to the previous figures retain the same numeric designation. The assembly 90 comprises a pair of lower first dice 14A and 14B connected to the substrate or leadframe 16. The lower dice 14A and 14B comprise face surfaces 18A and 18B, each having at least one flip chip electric connection 20A and 20B extending substantially perpendicularly from the bond pads 22A and 22B on the lower die face surfaces 18A and 18B. The flip chip electric connections 20A and 20B extend to the upper surface 24 of the substrate 16 in such a manner that the flip chip electric connections 20A and 20B make physical connection and electrical contact with the electrical contact elements 26 in or on the surface 24 of the substrate 16.

The back side 52 of second die 54 bridges and is adhered to both lower dice 14 with the layers of adhesive 28A and 28B applied over the lower die back sides 30A and 30B. The face side 56 of the second die 54 has a plurality of bond pads 58 disposed thereon. A plurality of bond wires 60 is attached between the second die bond pads 58 and corresponding trace or lead ends 40 on the upper surface 24 of the substrate 16. Additional components 62A and 62B, such as resistors, capacitors, or the like, may be adhered to the layers of adhesive 28A and 28B on the lower die back sides 30A and 30B. This arrangement frees up space on the substrate 16 that would normally be taken up by the components 62A and 62B. A second die-to-component bond wire 92 is attached between a respective first die bond pad 58 and the component 62B. A first component-to-substrate bond wire 94 is attached between the component 62B and the upper surface 24 of the substrate 16.

The back side 68 of the third die 70 is adhered to the second die 54 with the second layer of adhesive 72 applied on the second die face side 56. The face side 74 of the third die 70 has a plurality of bond pads 76 disposed thereon. A plurality of bond wires 78 is attached between the third die bond pads 76 and corresponding trace or lead ends 40 on the upper surface 24 of the substrate 16. A third die-to-component bond wire 96 is attached between a respective third die bond pad 76 and the component 62A. A second component-to-substrate bond wire 98 is attached between the component 62A to the upper surface 24 of the substrate 16.

Figure 5:
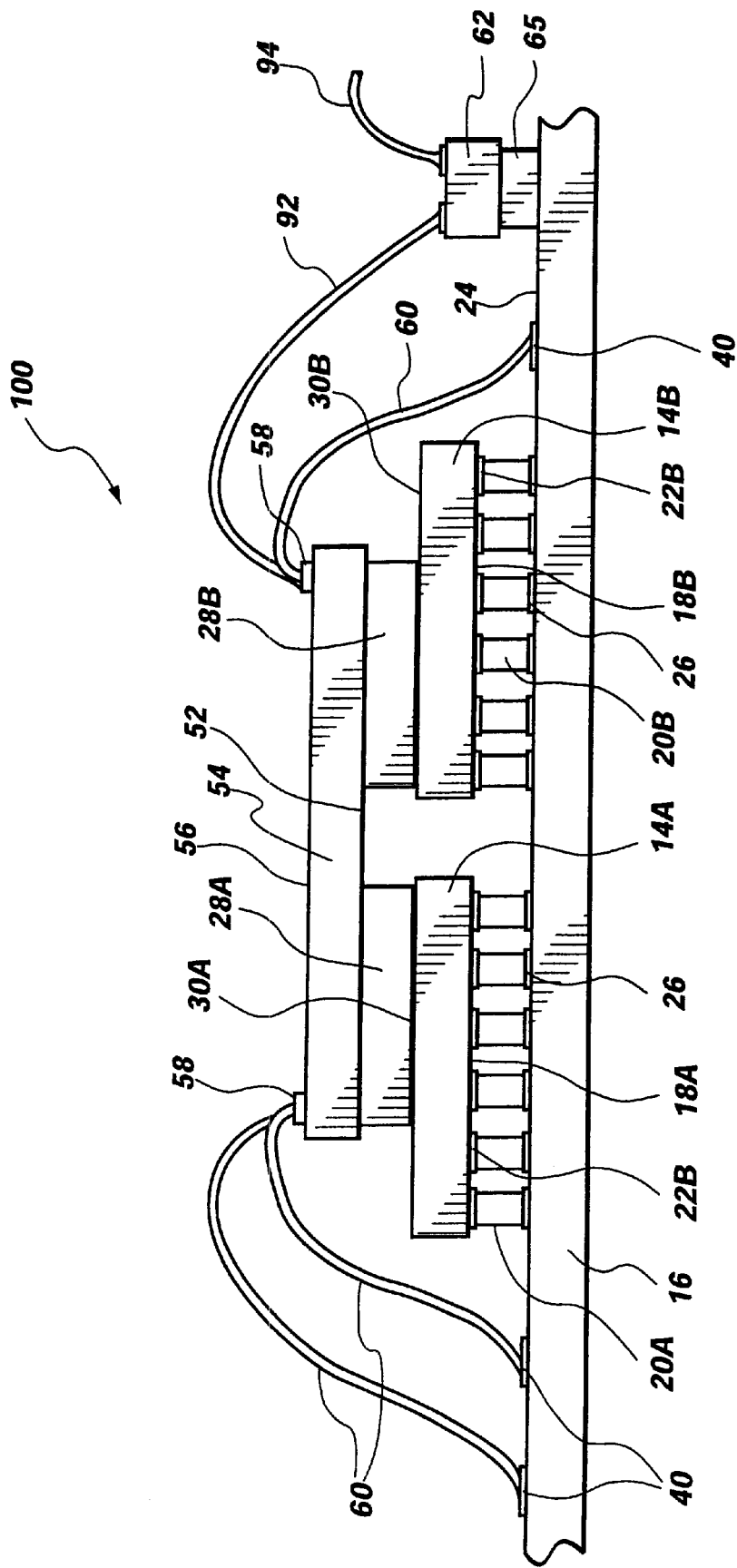
FIG. 5 is a side plan view of still another alternative assembly of the present invention.

FIG. 5 illustrates a second multiple base bare die assembly 100 of the present invention. Components common to the previous figures retain the same numeric designation. The assembly 100 comprises a pair of lower first dice 14A and 14B connected to the substrate or leadframe 16. The lower dice 14A and 14B comprise face surfaces 18A and 18B, each having at least one flip chip electric connection 20A and 20B extending substantially perpendicularly from the bond pads 22A and 22B on the lower die face surfaces 18A and 18B. The flip chip electric connections 20A and 20B extend to the upper surface 24 of the substrate 16 in such a manner that the flip chip electric connections 20A and 20B make physical connection and electrical contact with the electrical contact elements 26 in or on the surface 24 of the substrate 16.

The back side 52 of second die 54 bridges and is adhered to both lower dice 14A and 14B with the layers of adhesive 28A and 28B applied over the lower die back sides 30A and 30B. The face side 56 of the second die 54 has a plurality of bond pads 58 disposed thereon. A plurality of bond wires 60 is attached between the second die bond pads 58 and corresponding trace or lead ends 40 on the upper surface 24 of the substrate 16. An additional component 62, such as a resistor, capacitor, or the like, may be adhered to substrate or leadframe 16 by a layer of adhesive 65. A second die-to-component bond wire 92 is attached between a respective first die bond pad 58 and the component 62. A component-to-substrate bond wire 94 is attached between the component 62 and the upper surface 24 of the substrate 16.

It is, of course, understood that a number of configurations of this embodiment could be constructed. For example, multiple bridge dice may be employed over multiple lower dice; more than three levels of dice could be stacked; rectangular dice may be stacked with their major axes mutually perpendicular; a conductive die attach adhesive may be employed between a flipped base die and an upper stack die so that both dice may be grounded through the upper die's wire bonds to the substrate; bond pad layouts may be varied, and the like.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A bare semiconductor die assembly including a plurality of semiconductor dice, comprising:

a substrate including a plurality of conductors;

at least one active face-down base die on said substrate and in electrical communication with at least some of said conductors;

at least one other face-down base die on said substrate and in electrical communication with at least some of said conductors;

at least one active face-up stack die attached back-to-back to said at least one active face-down base die and said at least one other face-down base die such that the at least one active face-up stack die bridges said at least one active face-down base die and said at least one other face-down base die;

means for electrically connecting said at least one active face-up stack die to at least one of said plurality of substrate conductors;

at least one discrete component secured to at least one of said active face-up stack die, said at least one active face-down base die, and said substrate; and said at least one discrete component electrically connected to at least one of said active face-up stack die, said at least one active face-down base die, and said substrate.

2. The assembly of claim 1, wherein said at least one active face-up stack die includes at least one bond pad.

3. The assembly of claim 2, wherein said means for electrically connecting said at least one active face-up stack die to said at least one of said plurality of substrate conductors includes a bond wire extending between said at least one bond pad and said at least one of said plurality of substrate conductors.

4. The assembly of claim 1, further comprising a first adhesive interposed between said at least one active face-down base die and said at least one active face-up stack die.

5. The assembly of claim 1, further comprising a die-to-component bond wire electrically connecting said at least one active face-up stack die and said at least one discrete component.

6. The assembly of claim 1, further comprising a component-to-substrate bond wire electrically connecting said at least one discrete component to at least one of said plurality of substrate conductors.

7. The assembly of claim 1, further comprising a second stack die and means for electrically connecting said second stack die to at least one of said plurality of substrate conductors.

8. The assembly of claim 7, wherein said second stack die includes at least one bond pad.

9. The assembly of claim 8, wherein said means for electrically connecting said second stack die to at least one of said plurality of substrate conductors is a bond wire extending between said at least one second stack bond pad and at least one of said plurality of substrate conductors.

10. The assembly of claim 7, wherein said second stack die is attached to said at least one active face-up stack die.

11. The assembly of claim 10, further comprising a second adhesive interposed between said second stack die and said at least one active face-up stack die.

12. The assembly of claim 11, further comprising said at least one discrete component adhered to said second adhesive, and a die-to-component bond wire connecting said second stack die to said at least one discrete component.

13. The assembly of claim 11, further comprising said at least one discrete component adhered to said second adhesive, and a component-to-substrate bond wire connecting said at least one discrete component to at least one of said plurality of substrate conductors.

14. The assembly of claim 10, further comprising at least one discrete component adhered to a first adhesive, a die-to-component bond wire connecting said second stack die to said at least one discrete component, and a component-to-substrate bond wire connecting said at least one discrete component to at least one of said plurality of substrate conductors.

15. The assembly of claim 1, further including said at least one discrete component secured to said substrate, and a component-to-substrate bond wire electrically connecting said substrate to said at least one discrete component.

* * * * *

UNITED STATES PATENT AND TRADEMARK OFFICE
CERTIFICATE OF CORRECTION

PATENT NO. : 6,407,456 B1  Page 1 of 1
APPLICATION NO. : 09/510817
DATED : June 18, 2002
INVENTOR(S) : Michael B. Ball It is certified that error appears in the above-identified patent and that said Letters Patent is hereby corrected as shown below:

In the specification:

| | | |
|---|---|---|
| COLUMN 1, | LINE 62, | change "mirrorimage" to --mirror-image-- |
| COLUMN 2, | LINE 13, | change "are" to --is-- |
| COLUMN 2, | LINE 43, | change "diebonding" to --die-bonding-- |
| COLUMN 3, | LINE 8, | delete "are" |
| COLUMN 4, | LINE 18, | change "noncustomized" to --non-customized-- |
| COLUMN 6, | LINE 20, | change "trace lead ends" to --trace or lead ends-- |

In the claims:

| | | | |
|---|---|---|---|
| CLAIM 1, | COLUMN 7, | LINE 67 | after "said" and before "conductors" insert --plurality of-- |
| CLAIM 1, | COLUMN 8, | LINE 3, | before "conductors" insert --plurality of-- |
| CLAIM 1, | COLUMN 8, | LINE 16, | after "said" and before "active" insert --at least one-- |
| CLAIM 1, | COLUMN 8, | LINE 19, | after "said" and before "active" insert --at least one-- |
| CLAIM 3, | COLUMN 8, | LINE 27, | delete "substrate" |
| CLAIM 3, | COLUMN 8, | LINE 29, | delete "substrate" |
| CLAIM 6, | COLUMN 8, | LINE 43, | delete "substrate" |
| CLAIM 7, | COLUMN 8, | LINE 46, | delete "substrate" |
| CLAIM 9, | COLUMN 8, | LINE 53, | delete "substrate" |
| CLAIM 9, | COLUMN 8, | LINE 55, | delete "substrate" |
| CLAIM 13, | COLUMN 9, | LINE 3, | delete "substrate" |
| CLAIM 14, | COLUMN 10, | LINE 1, | delete "substrate" |

Signed and Sealed this

Eighth Day of August, 2006

JON W. DUDAS
*Director of the United States Patent and Trademark Office*